United States Patent
Aono

Patent Number: 5,310,301
Date of Patent: May 10, 1994

[54] CHIP FEEDER FOR CHIP MOUNTER

[75] Inventor: Takami Aono, Shizuoka, Japan

[73] Assignee: Tenryu Technics Co., Ltd., Shizuoka, Japan

[21] Appl. No.: 901,727

[22] Filed: Jun. 22, 1992

[30] Foreign Application Priority Data

Jun. 27, 1991 [JP] Japan ................... 3-156749

[51] Int. Cl.⁵ .............................................. H05K 13/04
[52] U.S. Cl. ................................... 414/416; 414/403; 414/411; 29/740; 226/62
[58] Field of Search .............. 414/225, 403, 411, 416, 414/627; 242/55.2, 55.53, 68.3, 76; 226/62, 64, 65, 67, 73, 151, 199, 147; 29/740, 741, 759; 156/344

[56] References Cited

U.S. PATENT DOCUMENTS

| | | | |
|---|---|---|---|
| 3,608,175 | 9/1971 | Lambrecht | 414/416 X |
| 4,437,232 | 3/1984 | Araki et al. | 414/627 X |
| 4,610,083 | 9/1986 | Campisi et al. | 414/225 X |
| 4,768,915 | 9/1988 | Fujioka | 414/416 |
| 4,952,113 | 8/1990 | Fujioka | 414/416 |
| 5,191,693 | 3/1993 | Umetsu | 414/416 X |

Primary Examiner—Michael S. Huppert
Assistant Examiner—James T. Eller, Jr.

[57] ABSTRACT

A chip feeder comprising a sprocket for feeding intermittently a tape, which contains a plurality of chips and is sealed with a protective tape, at predetermined pitch intervals to a chip takeout portion; a roller for peeling the protective tape sealing the chip from the the tape fed intermittently; and a vacuum suction nozzle for taking up a chip out of the tape from which the protective tape is peeled off, wherein the roller peels the protective tape immediately before the vacuum suction nozzle takes out the chip when the tape is in a stationary state.

6 Claims, 7 Drawing Sheets

CHIP FEEDER FOR CHIP MOUNTER

BACKGROUND OF THE INVENTION

1. Field of the Invention

The present invention relates to a chip feeding technology, and particularly to a technology which is used for effectively feeding chip-shaped electronic parts to a chip mounter.

2. Related Art Statement

In the case where chip-shaped electronic parts such as semiconductor devices, resistors, capacitors, or the like are mounted onto a circut board etc., it is considered that chips are lined and held on a tape at predetermined intervals; the tape is fed intermittently to a chip takeout portion from a tape supplying portion such as a tape reel; and then a chip is taken out of the tape to a chip mounter at the chip takeout portion to mount it on a board by the chip mounter.

In such a chip feeding technology, a protective tape is peeled off from the holding tape, and thereafter a chip is taken out of the holding tape at a chip takeout position. However, in the process of moving from the peeling position to the takeout position, there is a fear of a chip jumping out of the chip holding hole in the tape due to an external force such as vibration.

For that reason, U.S. Pat. No. 4,952,113 discloses to arrange a shutter member covering the chip holding portion after the protective tape is peeled off so that a chip is prevented from jumping out of the chip holding hole. However, such a structure has a disadvantage in that a moving mechanism for the shutter member necessitates a complicated and large-sized structure, an increased number of parts, and high speed movement that easily invites damage and unstable operation of the moving mechanism.

SUMMARY OF THE INVENTION

An object of the present invention is to provide a chip feeder for a chip mounter, which has a simplified and small structure. Another object is to provide a chip feeder which can prevent reliably a chip from ejecting out of a holding tape. A further object is to provide a chip feeder which realizes decreased number of parts, improved durability, and stabilized operation.

According to the present invention, a chip feeder for a chip mounter, which feeds a plurality of chips held on a tape from a tape supplying portion to a chip takeout portion of the chip mounter, comprises: a tape feeding means for feeding intermittently a tape sealed with a protective tape to the chip takeout portion at predetermined intervals; a protective tape peeling means for peeling off the protective tape from the tape fed by the tape feeding means; and a chip takeout means for taking the chip out of the tape from which the protective tape has been peeled off, wherein the peeling means peels off the protective tape immediately before the chip takeout means takes out the chip when the tape is in a stationary state.

The tape feeding means, the protective tape peeling means, and the chip takeout means may be moved cooperatively by way of interlocking members.

Both the tape feeding means and the protective tape peeling means may be operated by means of the driving source for the chip mounter which drives the chip takeout means.

Furthermore, the tape feeding means, the protective tape peeling means, and the chip takeout means may be operated by means of the biasing force of a spring member when released from the operation by the driving means.

The protective tape peeling means may be comprised of a protective tape take-up means for taking up and peeling the protective tape from the tape at every predetermined length; and a protective tape guiding member for guiding the protective tape to the take-up means by contacting the peeled protective tape at the tip end of the guiding member and by turning it back in the reverse direction with respect to the feeding direction. The protective tape guiding member may move in the feeding direction together with the tape at the time of feeding operation, and move in the reverse direction with respect to the tape feeding direction immediately before the chip is taken out by the chip takeout means.

Furthermore, the protective tape guiding member may be constructed so as to close to and separate from the chip takeout portion.

In the protective tape guiding member, one side of the tip end of the guiding member may be contacted with the surface of the protective tape immediately before peeling.

In the chip feeder for a chip mounter according to the present invention, after the tape feeding means feeds the tape sealed with the protective tape to the chip takeout portion, the peeling means peels the protective tape sealing the chip immediately before the chip takeout means takes out the chip. As a result, the chip can be prevented from jumping out of the chip holding hole, without using a shutter member.

Therefore, the simiplified and small sized structure can prevent reliably a chip from jumping out of the protective tape, and realize reduced number of parts, improved durability, and stable operation.

In this case, when the tape feeding means, the protective tape peeling means, and the chip takeout means are mutually operationally connected by way of common interlocking members, the structure of the chip feeder can be simplified and its size can be reduced.

If both the tape feeding means and the protective tape peeling member are driven by a drive source for the chip takeout means, the chip feeder can be simplified and miniaturized in comparision with a structure wherein a chip feeder has its own drive source, because the drive force for the chip feeder is supplied from the chip mounter's drive source.

If the tape feeding means, the protective tape peeling means, the chip takeout means are operated by the biasing force of spring members when release from the operation by the drive source, the effective use of the biasing force of the spring means can decrease the consumption of the drive force of the drive source.

Also the protective tape peeling means may be co₁-structed to comprise a protective tape take-up means for taking up and peeling the protective tape from the tape at every predetermined length; and a protective tape guiding member for guiding the protective tape to the take-up means by contacting the protective tape at the tip end of the guiding member and by turning it back in the reverse direction with respect to the tape feeding direction. The protective tape guiding member may move in the tape feeding direction together with the tape being in a feeding operation, and move in the reverse direction with respect to the tape feeding direction immediately before the chip is taken out by the chip takeout means. Thus, it is possible to prevent the chip from dropping accidentally out of the holding tape with a structure employing a small number of parts consisting of only the take-up means and the protective tape guiding member.

BRIEF DESCRIPTION OF THE DRAWINGS

The above and other objects and features of the present invention will become more apparent when referred to the following descriptions given in conjunction with the accompanying drawings, wherein like reference numerals denote like elements, and in which.

DETAILED DESCRIPTION OF THE PREFERRED EMBODIMENTS

Figure 1:
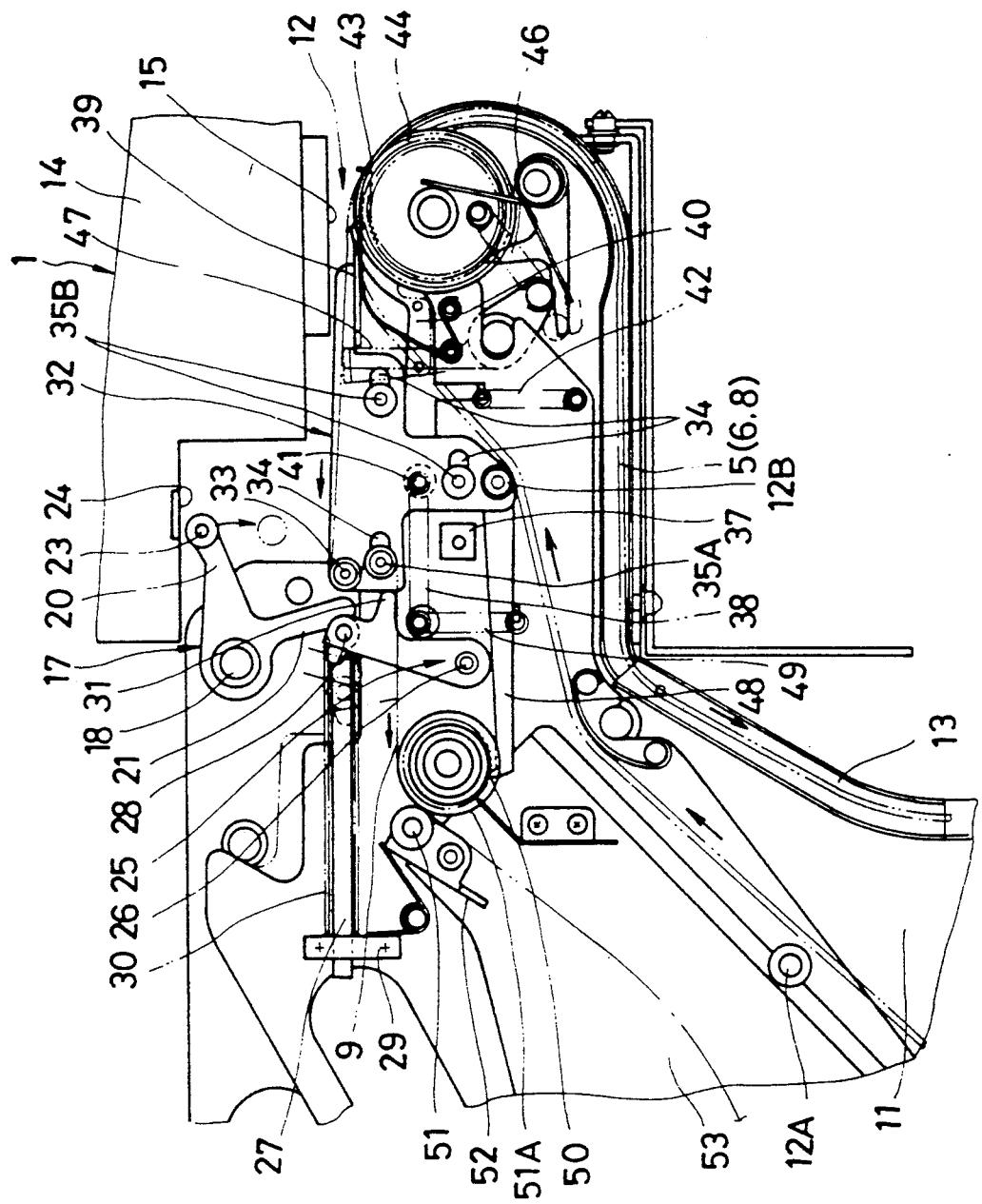
FIG. 1 is a cross sectional view showing one embodiment of a chip feeder for a chip mounter according to the present invention.

Referring to the drawings, a chip feeder for a chip mounter is constructed in such a manner that a chip 3 such as chip-shaped electronic parts is fed from a tape feeding portion (not shown) to the chip takeout portion 2 of the chip mounter 1.

Figure 4:
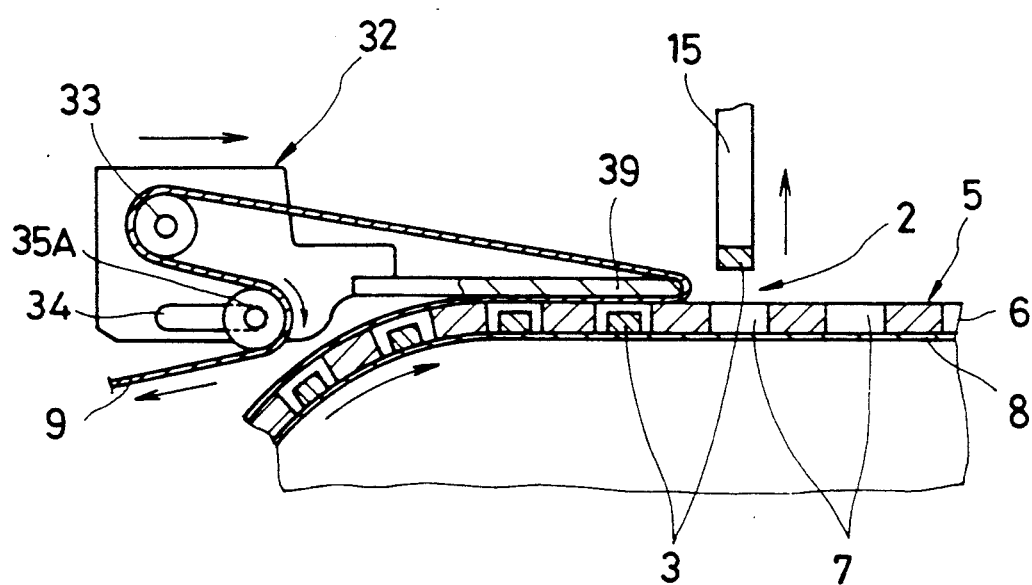
FIGS. 4, 5 and 6 are schematic cross sectional views explaining the operation of the chip feeder.
Figure 5:
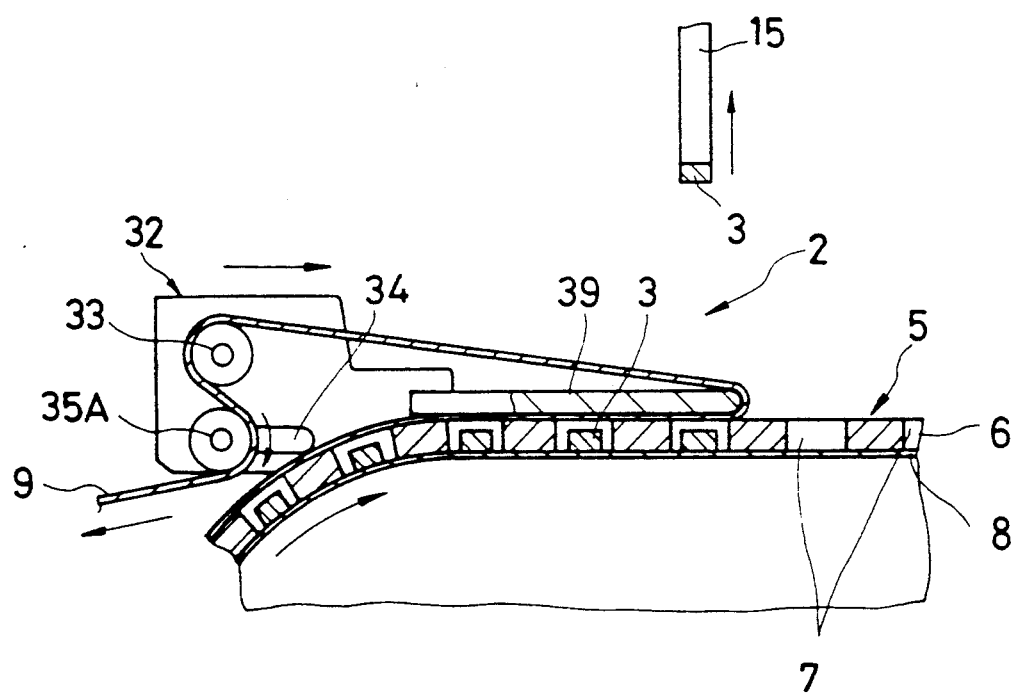
Figure 6:
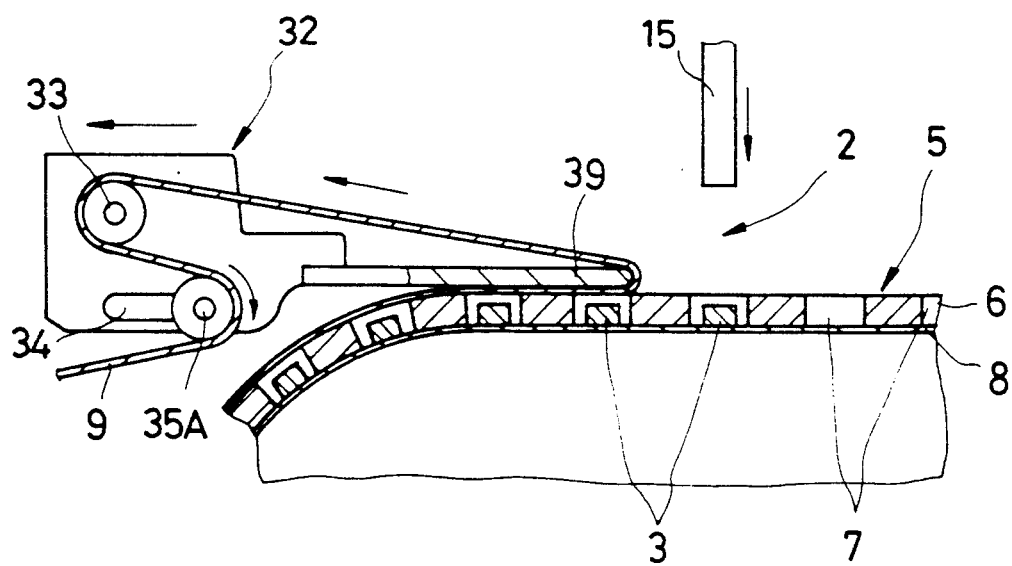

As shown in FIGS. 4 to 6, the chips 3 are accommodated in the chip holding holes 7 which are formed in the holding tape 6 of a tape 5 at a predetermined pitch. The supporting tape 8 supports the chips 3 at the lower side of the holding holes 7 to prevent them from dropping, and a protective tape seals the upper side of the holding holes 7 to prevent the chips 3 from jumping out.

The tape 5 holds a plurality of chips 3 provided in line at predetermined pitch, and is wound on a reel (not shown) which is mounted rotatably to the frame 11 in the tape feeding portion (not shown).

Figure 2:
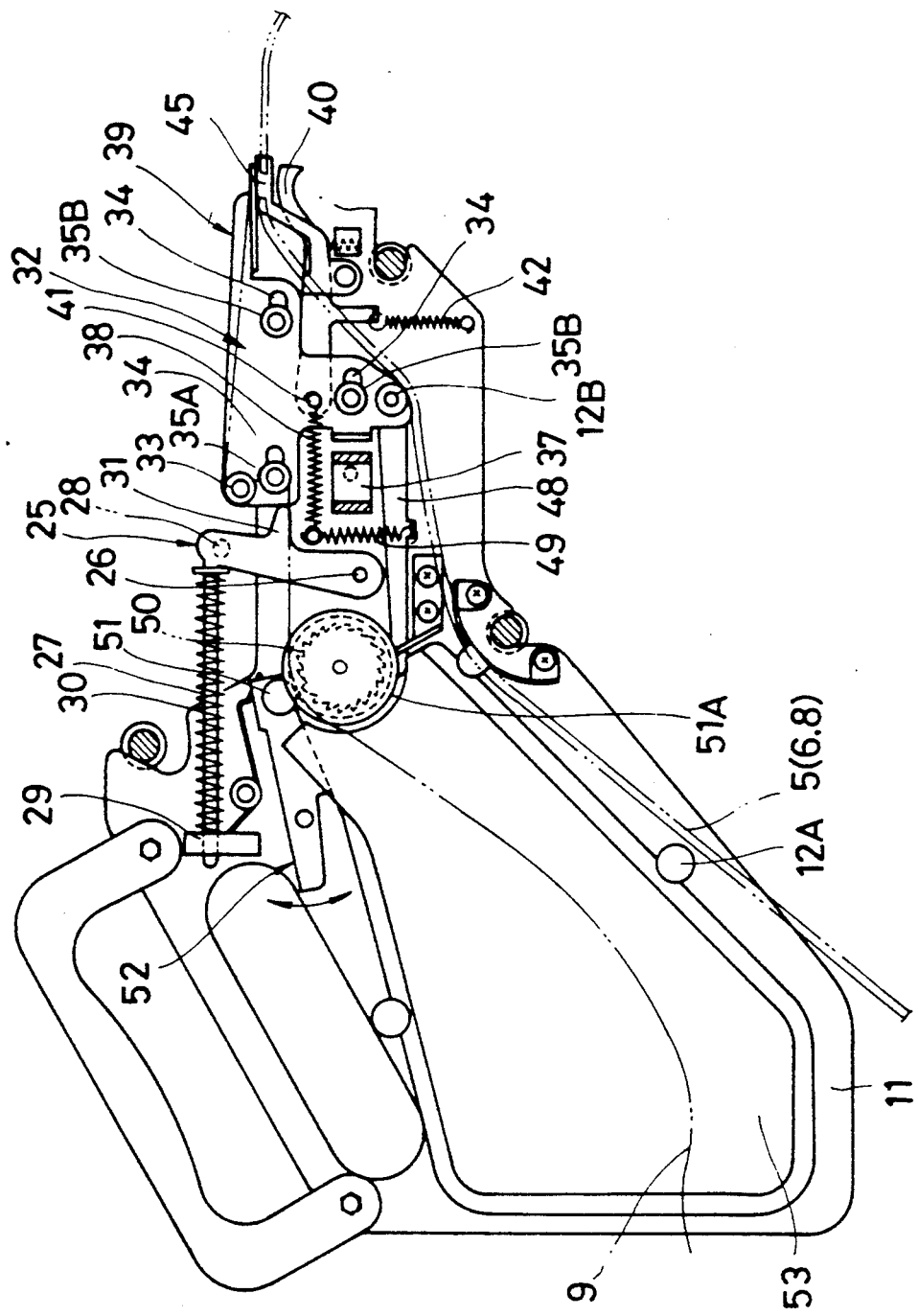
FIGS. 2 and 3 are partial cross sectional views thereof.

As shown in FIG. 1, the tape 5 is wound off by way of the rollers 12A and 12B from the reel. As shown in FIGS. 3, 4, 5 and 6, at the chip takeout portion 2, a chip 3 is sucked by a vacuum suction nozzle (chip takeout means) 15 equipped at the lower end of the chip mounter 1 and is taken out of the chip holding hole 7. Then, as shown in FIGS. 1 and 2, both empty holding tape 6 and the supporting tape 8 are guided to the path 13 to be ejected.

Above the frame 11, the working lever 17 is rotably mounted to the frame 11 being pivoted with a pin 18 so as to rotate clockwise from the position shown in solid line in FIG. 1. The working lever 17 has a first arm portion 20 and a second arm portion 21.

At the first arm portion 20 of the working lever 17, a roller 23 is mounted vertically with respect to the surface of the page showing FIG. 1. The roller 23 is driven downward in the direction of the arrow A by means of the working head 24 which operates in accordance with the vertical motion of the piston rod (not shown) in an air cylinder acting as a drive source for the chip mounter. That is, the working lever 17 is driven in common by the air cylinder which is the drive source of the chip mounter 1 itself. Therefore, in the present embodiment, no separate drive source is required for the chip feeder so that the whole device of the chip feeder is of a simplified and small sized construction.

The second arm portion 21 of the working lever 17 is in contact at its tip end with a knock lever 25 and is operationally connected to the knock lever 25.

The knock lever 25 is mounted rotatably to the frame 11 on a pin 26 as a pivot, and a spring guide 27 is coupled oscillatably to the knock lever 25 with a pin 28 as a pivot.

The spring guide 27 penetrates slidably a supporting portion 29, and a drive spring 30 is coupled to the spring guide 27 as a drive source.

The drive spring 30 biases the knock lever 25 clockwise direction in FIG. 1. By the biasing force of the drive spring 30, an arm portion 31 of the knock lever 25 is contacted to a left end of a guide plate 32, and is operationally connected to it. A first roller (protective tape take-up means) 33 is pivotally provided to the guide plate 32, and elongated holes 34 are provided to be open in the guide plate 32.

A second rollers 35A and 35B are arranged loosely in the elongated holes 34 of the guide plate 32 respectively and pivoted to the frame 11 so as to guide slidably and horizontally the guide plate 32, as shown in FIG. 1.

The stop position on the left side in FIG. 1 of the guide plate 32 can be varied by adjusting a stroke adjusting member 37, whereby the stroke of the guide plate 32 can be adjusted to plural stages.

The guide plate 32 is biased in the left direction in FIG. 1 by means of a drive spring 38 acting as a drive source, with the biasing force of the drive spring 38 being smaller than that of the drive spring 30.

A peeling plate (protective tape guiding member) 39 is attached to the tip side (the rightmost side in FIG. 1) of the guide plate 32 so as to protrude from it.

Since the peeling plate 39 slides together with the guide plate 32, the tip end side of the peeling plate 39 can close to or separate from the chip takeout portion 2 of the chip mounter 1.

A working pawl 40 is mounted on the guide plate 32 in a freely swinging manner with the pin 41 acting as a fulcrum, and biased downward in FIG. 1 by a pulling spring 42.

Figure 7:
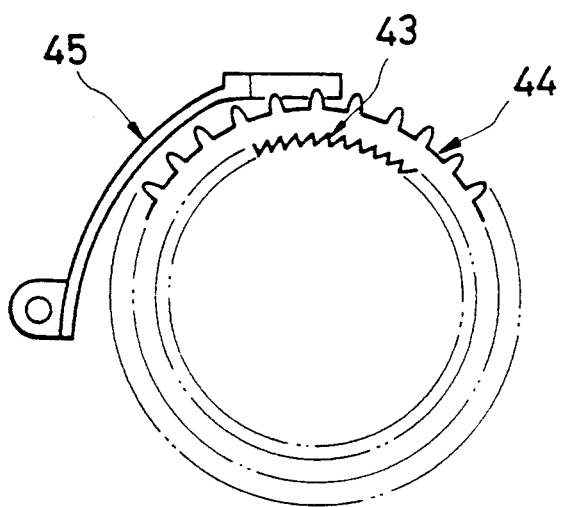
FIG. 7 is a partial front view of the chip feeder.

The tip of the working pawl 40 is engaged with teeth of a ratchet wheel 43 which is mounted freely rotatably to the frame 11, and thereby the ratchet wheel 43 rotates intermittently in one direction, or clockwise in FIG. 1. A sprocket 44 (tape feeding mechanism) is fixed coaxially to the ratchet wheel 43 so as to rotate together with the ratchet wheel 43. As shown in FIG. 7, the teeth of the sprocket 44 are engaged with the pitch holes of the tape 5 (not shown) which is guided under the pressure of a tape pressing means 45, and thereby the teeth of the sprocket 44 feed intermittently by pitch the tape 5 at every predetermined length.

Figure 3:
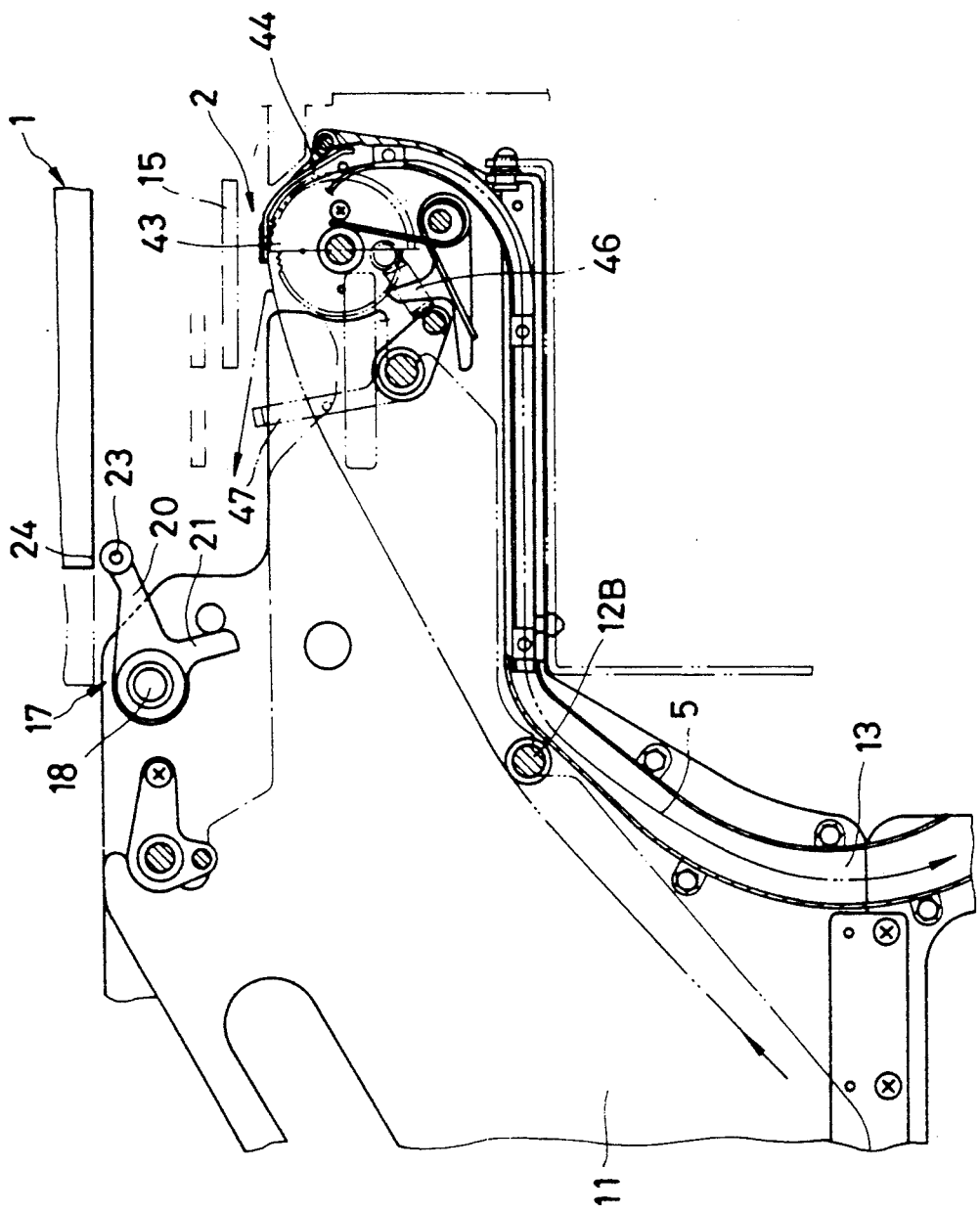

As shown in FIGS. 1 and 3, a reverse rotation preventing pawl 46 prevents the rotation of the ratchet wheel 43 in the counterclockwise direction in the same Figures, and can be released from the engagement with the teeth of the ratchet wheel 43 by operating a release lever 47.

As shown in FIGS. 1 to 2, a working pawl 48 is provided to the guide plate 32 in a freely swinging manner sharing the axial core with the roller 12B, and biased in the upward direction in these Figures by the pulling spring 49.

The tip of the working pawl 48 is engaged with teeth of a ratchet wheel 50 mounted rotatably to the frame 11, and rotates intermittently the rachet wheel 50 in one direction, or clockwise in FIG. 1. The winding roller 51A is fixed coaxially to the ratchet wheel 50, and is rotated together with the rotation of the ratchet wheel 50.

The protective tape 9 removed from the tape 5 is inserted between the winding roller 51A and a pressure roller 51 pressed to the winding roller 51A, and is drawn into the tape pocket 53 with the rotation of the rollers 51A and 51B.

The pressure roller 51, as shown in FIG. 2, can be released from a condition of being pressed to the winding roller 51A by operating the releasing lever 52 to permit insertion of the protective tape 9 between the rollers 51 and 51A.

Next, an operation of the present embodiment is explained.

First, as shown in two-dot line in FIG. 1, the tape 5 wound on the reel (not shown), which includes chips 3 housed in the chip holding holes 7 and covered with the protective tape 9 on the upper side thereof, is sent between the lower surface of the tape pressure 45 and the upper surface of sprocket the 44 by way of the rollers 12A and 12B, and then introduced into the path 13.

The protective tape 9 is peeled off out of the tape 5, and the free end of the protective tape 9 passes the rollers 33 and 35A to be inserted to and held between the winding roller 51A and the pressure roller 51 and then sent into the tape pocket 53, as shown in two-dot line in FIG. 1.

In that case, as shown in FIGS. 4 to 6, the proximal end of the protective tape 9 is in contact with the tip end portion of the peeling plate 39 and turned back toward the winding roller 51A so as not to be slackened between the peeling plate 39 and the winding roller 51A. Next, in the state shown in FIG. 1, when the piston rod (not shown) in the air cylinder as the drive source for the chip mounter is made to go down by a predetermined stroke, both the suction nozzle 15 and the working head 24 also descend accompanying the piston rod.

When the descending working head 24 presses down the roller 23 of the working lever 17, the working lever 17 rotates clockwise against the biasing force of the drive spring 30, while the knock lever 25 rotates counterclockwise.

In response to the counterclockwise rotation of the knock lever 25, the guide plate 32 slides in the left direction in the FIG. 1 by the biasing force of the drive spring 38 till the guide plate 32 contacts with the stroke adjusting member 37 from the state shown in the FIG. 1. And the peeling plate 39 also slides together with the guide plate 32.

When, as shown in FIG. 6, the roller 33 is displaced similarly together with the guide plate 32 in the left direction of the Figure, the protective tape 9 is drawn in the direction of the arrow, whereby the protective tape 9 is peeled off from the tape 5 by the length of sealing one chip holding hole 7. During the peeling-off of the protective tape 9, the ratchet wheels 43 and 50 are stopped to rotate. Therefore feeding of the tape 5 by means of the sprocket 44 and winding up of the protective tape 9 by means of the winding roller 51A and the pressure roller 51 are stopped.

Immediately after the peeling off of the protective tape 9, while the chip feeder is stopped, the descending vacuum suction nozzle 15 of a chip removing member 14 sucks the chip 3 in the chip holding hole 7 over which the protective tape 9 has been peeled off. Then, the piston rod (not shown) of the air cylinder being a drive source for the chip mounter 1 is lifted up by a predetermined stroke so that the chip 3 is taken up out of the chip holding hole 7 as shown in FIG. 4, and moves further upward as shown in FIG. 5.

The working head 24 is lifted up together with the vacuum suction nozzle 15 so that the working lever 17 rotates counterclockwise by the biasing force of the drive spring 30, while the knock lever 25 rotates clockwise. With the clockwise rotation of the knock lever 25, the guide plate 32 and the peeling plate 39 slide in the right direction in the FIG. 1 against the biasing force of the drive spring 38.

In accordance with the sliding of the guide plate 32 and the peeling plate 39, the tip of the working pawl 40 rotates intermittently the ratchet wheel 43 clockwise by a predetermined angle. Together with the ratchet wheel 43, the sprocket 44 rotates intermittently clockwise to move the tape 5 by one pitch to the path 13. By this movement of the tape 5, a chip 3 in the next chip holding hole 7 is fed to the chip takeout portion 2 to be sucked with the vacuum suction nozzle. Together with the feeding of the tape 5, the peeling plate 39 displaces in the feeding direction. That is, as shown in FIG. 5, the peeling plate 39 is displaced while covering the protective tape 9 which seals the chip holding hole 7; therefore the protective tape 9 is fed to the chip takeout portion 2 while sealing the chip holding hole 7, without being peeled off from the tape 5.

When the guide plate 32 and the peeling plate 39 are slid to the right in FIG. 1, the ratchet wheel 50 is rotated intermittently counterclockwise by the working pawl 48 by a predetermined angle. The winding roller 51A rotates accompanying the rotation of the ratchet wheel 50 so that the protective tape 9, which is slackened between the roller 35A and the winding roller 51A by the length of taking up by the roller 33, is pulled toward the tape pocket 53 to the extent of the slackened length.

Approximately at the same time when the chip 3 in the next chip holding hole 7 is fed to the chip takeout portion 2 in the above-described manner, the piston rod (not shown) in the air cylinder as a drive source of the chip mounter 1 is made to descend by a predetermined stroke, together with the suction nozzle 15 and the working head 24.

Then, by this descending movement, the protective tape 9 is removed from the tape 5 as described above, and then the chip 3 is taken out by the vacuum suction nozzle 15.

In such a manner, according to the present embodiment, immediately before the vacuum suction nozzle 15 takes up the chip 3, the protective tape 9 covering the chip 3 is peeled off, whereby the chip 3 can be prevented from jumping out of the chip holding hole 7 without arranging a shutter member. Such a simplified and small structure can prevent certainly the chip 3 from jumping out of the chip holding hole 7, and can realize reduction of the number of parts, improved durability and stabilized operation.

Thus, the invention made by the present inventor has been explained based on the embodiment. However, the present invention should not be limited to the embodiment, and it is needless to say that various modifications are possible without departing from the scope of the invention.

For example, the chip feeder may be installed in any way. A plurality of the chip feeders may be installed to single frame, or may be mounted respectively and directly to parts feeding brackets of the chip mounter without being mounted to the frame.

The peeled protective tape 9 may be wound on a protective tape winding reel, without being stored in the tape pocket 53.

(1) According to the present invention, after the tape feeding means feed a tape covered with a protective tape to the chip takeout portion, the protective tape covering a chip is peeled off by the peeling means immediately before the chip takeout means takes out the chip. By this, the chip is prevented from jumping out of the chip holding hole, without using a shutter member. Such a simplified and small structure can prevent reliably the chip from jumping out of the holding tape, thus realizing reduction of the number of parts, improved durability, and stable operation.

(2) Further, if the tape feeding means, the protective tape peeling means, and the chip takeout means are operated by way of the common interlocking members, a simplified and small size structure can be realized.

(3) Further, if both the tape feeding means and the protective tape peeling means are operated by a drive source which drives the chip takeout means, a smaller sized and simplified structure can be obtained in comparison with a chip feeder itself having its own drive source, since a drive force for the chip feeder is provided from the drive source of the chip mounter.

(4) Further, if the tape feeding means, the protective peeling means, and the chip takeout means are operated by the biasing force of a spring member when released from the operation by said drive source, the effective use of the biasing force thereof can reduce the consumption of the drive force from the drive source.

(5) Further, the protective tape peeling means may comprise a protective tape take-up means for taking and peeling the protective tape from the tape by every predetermined length; and a protective tape guiding member for turning back the peeled protective tape in the direction reverse to the feeding direction and for guiding to the take-up means, with the peeled protective tape being contacted with the tip of the peeling plate. During the feeding operation, the protective tape guiding member moves in the feeding direction together with the tape, and the chip takeout means moves in the reverse direction with respect to the feeding direction just before the chip is taken out. In such a structure, it is possible to prevent reliably a chip from jumping out, using the structure consisted of a small number of members, i.e. only the take-up means and the protective tape guiding member.

What is claimed is:

1. A chip feeder for a chip mounter, wherein a plurality of chips held in a tape are fed from a tape feeding portion to a chip takeout portion of the chip mounter, comprising:

a tape feeding means for feeding intermittently the tape sealed with a protective tape to the chip takeout portion at predetermined pitch intervals;

a protective tape peeling means for peeling the protective tape from the tape fed intermittently by the tape feeding means, said protective tape peeling means comprising a protective tape take-up means for taking up and peeling said protective tape from said tape by every predetermined length, a protective tape guiding member which turns back the protective tape in a direction reverse to a feeding direction and guides the protective tape peeled off to the take-up means with end tip of the protective tape guiding member contacting with the protective tape, said protective tape guiding member moving in the feeding direction together with said tape when the tape is fed and moving in the direction reverse to the feeding direction immediately before said chip is taken out by the chip takeout means; and a chip takeout means for taking out the chip from the tape from which the protective tape has been peeled, said peeling means peeling off the protective tape sealing the chip during a descent of said chip takeout means to a chip takeout position immediately before the chip takeout means takes out the chip when the tape is in a stationary state.

2. The chip feeder according to claim 1, wherein:
said tape feeding means, said protective tape peeling means, and said chip takeout means are operated by way of interlocking members which operationally connect the tape feeding means, the protective tape peeling means and chip takeout means with each other.

3. The chip feeder according to claim 2, wherein said tape feeding means, said protective tape peeling means, and said chip takeout means are operated by an biasing force of spring members when released from driving of a drive source.

4. The chip feeder according to claim 1, wherein:
the tape feeding means and the protective tape peeling means are operated by a drive source of said chip mounter, which drives said chip takeout means.

5. The chip feeder according to claim 1, wherein:
said protective tape guiding member moves towards the chip takeout position during the feeding of the tape, and said protective tape guiding member moves away from the chip takeout position during the descent of the chip takeout means.

6. The chip feeder according to claim 1, wherein:
one side of an end surface of said protective tape guiding member is in contact with a surface of said protective tape immediately before the protective tape is peeled off.

* * * * *